United States Patent
Ichikawa et al.

(10) Patent No.: US 11,420,255 B2
(45) Date of Patent: Aug. 23, 2022

(54) FILM-SHAPED FIRING MATERIAL AND FILM-SHAPED FIRING MATERIAL WITH A SUPPORT SHEET

(71) Applicant: LINTEC CORPORATION, Tokyo (JP)

(72) Inventors: Isao Ichikawa, Tokyo (JP); Hidekazu Nakayama, Tokyo (JP)

(73) Assignee: LINTEC Corporation, Tokyo (JP)

( * ) Notice: Subject to any disclaimer, the term of this patent is extended or adjusted under 35 U.S.C. 154(b) by 372 days.

(21) Appl. No.: 16/645,916

(22) PCT Filed: Sep. 3, 2018

(86) PCT No.: PCT/JP2018/032623
§ 371 (c)(1),
(2) Date: Mar. 10, 2020

(87) PCT Pub. No.: WO2019/054225
PCT Pub. Date: Mar. 21, 2019

(65) Prior Publication Data
US 2020/0276645 A1    Sep. 3, 2020

(30) Foreign Application Priority Data

Sep. 15, 2017    (JP) .............................. JP2017-177833

(51) Int. Cl.
*B22F 7/04*    (2006.01)
*B22F 7/08*    (2006.01)
(Continued)

(52) U.S. Cl.
CPC ................. *B22F 7/04* (2013.01); *B22F 7/08* (2013.01); *B32B 7/12* (2013.01); *B32B 27/18* (2013.01);
(Continued)

(58) Field of Classification Search
CPC ..... H01L 24/29; H01L 24/94; H01L 21/6836; H01L 2224/296; H01L 2224/8384; B32B 7/12; B22F 5/006; B22F 7/04; B22F 7/08
See application file for complete search history.

(56) References Cited

U.S. PATENT DOCUMENTS 8,257,795 B2    9/2012 Lu et al.
2007/0183920 A1    8/2007 Lu et al.
(Continued)

FOREIGN PATENT DOCUMENTS

CN    103357870 A    10/2013
CN    103902096 A    7/2014
(Continued)

OTHER PUBLICATIONS

International Search Report for PCT/JP2018/032623 dated Oct. 30, 2018, 4 pages.
(Continued)

*Primary Examiner* — David A Zarneke
(74) *Attorney, Agent, or Firm* — Nixon & Vanderhye P.C.

(57) ABSTRACT

A film-shaped firing material 1 is provided, including sinterable metal particles 10 and a binder component 20, in which a content of the sinterable metal particles 10 is in a range of 15% to 98% by mass, a content of the binder component 20 is in a range of 2% to 50% by mass, a shrinkage factor in a planar direction of the film-shaped firing material after being pressurized and fired under conditions of a temperature of 350° C. and a pressure of 10 MPa for 3 minutes is 10% or less with respect to the shrinkage factor before the firing, and a volume shrinkage factor thereof is in a range of 15% to 90% with respect to the volume shrinkage factor before the firing, and a contact ratio of the film-shaped firing material with an adherend after being pressurized and fired under conditions of a temperature of 350° C. and a pressure of 10 MPa for 3 minutes in
(Continued)

a state in which the film-shaped firing material is in contact with the adherend is 90% or greater with respect to a contact area of the adherend.

5 Claims, 2 Drawing Sheets

(51) Int. Cl.
 *B32B 7/12* (2006.01)
 *B32B 27/18* (2006.01)
 *H01L 23/00* (2006.01)
(52) U.S. Cl.
 CPC .............. *H01L 24/29* (2013.01); *H01L 24/94* (2013.01); *B22F 2301/255* (2013.01); *B22F 2304/054* (2013.01); *H01L 2224/296* (2013.01); *H01L 2224/2929* (2013.01); *H01L 2224/29339* (2013.01); *H01L 2224/29387* (2013.01); *H01L 2224/8384* (2013.01); *H01L 2924/20109* (2013.01)

(56) References Cited

U.S. PATENT DOCUMENTS

| | | | |
|---|---|---|---|
| 2016/0121435 A1 | 5/2016 | Furukawa et al. | |
| 2017/0025374 A1 | 1/2017 | Fujiwara et al. | |

FOREIGN PATENT DOCUMENTS

| | | |
|---|---|---|
| EP | 3358609 | 8/2018 |
| JP | 2004-143546 A | 5/2004 |
| JP | 2005-55975 A | 3/2005 |
| JP | 2006-321715 | 11/2006 |
| JP | 4502977 B2 | 4/2010 |
| JP | 2014-111800 | 6/2014 |
| JP | 2014-224296 | 12/2014 |
| JP | 2016-121329 A | 7/2016 |
| JP | 2017-069557 | 4/2017 |
| JP | 2017-069559 | 4/2017 |
| TW | 201435036 A | 9/2014 |

OTHER PUBLICATIONS

Office Action dated Jun. 29, 2021 in Chinese Application No. 201880059075.3 with English translation of the Search Report only, 8 pages.
Taiwanese Office Action dated Nov. 8, 2021 in Taiwanese Application No. 107131722, with partial English translation (Search Report only), 6 pages.
Notice of Reasons for Rejection dated Dec. 8, 2020 in Japanese Application No. 2019-542004, with English translation, 9 pages.
Extended European Search Report dated Jan. 13, 2021 in European Application No. 18855684.9, 7 pages.

FILM-SHAPED FIRING MATERIAL AND FILM-SHAPED FIRING MATERIAL WITH A SUPPORT SHEET

TECHNICAL FIELD

The present invention relates to a film-shaped firing material and a film-shaped firing material with a support sheet.

This application is the U.S. national phase of International Application No. PCT/JP2018/032623 filed Sep. 3, 2018 which designated the U.S. and claims priority to Japanese Patent Application No. 2017-177833, filed on Sep. 15, 2017, the contents of each of which are incorporated herein by reference.

BACKGROUND ART

In recent years, with the high voltage and high current of automobiles, air conditioners, and personal computers, the demand for power semiconductor elements (power devices) to be mounted on these has increased. Since a power semiconductor element is used in a high-voltage and high-current environment, generation of heat from the semiconductor element may become a problem.

In the related art, a heat sink is attached to the periphery of a semiconductor element in some cases for the purpose of heat dissipation of heat generated from the semiconductor element. However, in a case where the thermal conductivity in a portion where the heat sink and the semiconductor element are bonded is not excellent, efficient heat dissipation is affected.

As a bonding material with excellent thermal conductivity, for example, Patent Document 1 discloses a paste-like metal fine particle composition in which specific heat-sinterable metal particles, a specific polymer dispersant, and a specific volatile dispersion medium are mixed. It is considered that a solid metal with excellent thermal conductivity is obtained in a case where the composition is sintered.

CITATION LIST

Patent Literature

[Patent Document 1] Japanese Unexamined Patent Application, First Publication No. 2014-111800

DISCLOSURE OF INVENTION

Technical Problem

However, in a case where a firing material is in the form of a paste as described in Patent Literature 1, the thickness of the paste to be applied is unlikely to be uniform, and the thickness stability tends to be poor.

Meanwhile, the firing material is used for sinter bonding of a substrate and chips which have been divided by dicing a semiconductor wafer. Typically, the chips and the substrate are transported in a state of being temporarily fixed by the firing material before being fired. Accordingly, in a case where the adhesive force of the firing material is insufficient, the chips are shifted at the time of the transport before the firing material is fired. Further, in a case where the firing material is sintered, shrinkage occurs, and thus the adhesiveness between the chips and the substrate is degraded in some cases. As a result, the chips may be peeled off from the substrate after the firing material is fired, and thus long-term use of the device becomes difficult.

The present invention has been made in consideration of the above-described circumstances, and an object thereof is to provide a film-shaped firing material which has excellent thickness stability and in which chip shift before the firing and chip peeling after the firing are unlikely to occur at the time of use for bonding chips to a substrate. Further, another object thereof is to provide a film-shaped firing material with a support sheet which includes the film-shaped firing material.

Solution to Problem

The present invention includes the following aspects.

[1] A film-shaped firing material, including: sinterable metal particles; and a binder component, in which a content of the sinterable metal particles is in a range of 15% to 98% by mass, a content of the binder component is in a range of 2% to 50% by mass, a shrinkage factor in a planar direction of the film-shaped firing material after being pressurized and fired under conditions of a temperature of 350° C. and a pressure of 10 MPa for 3 minutes is 10% or less with respect to the shrinkage factor before the firing, and a volume shrinkage factor thereof is in a range of 15% to 90% with respect to the volume shrinkage factor before the firing, and a contact ratio of the film-shaped firing material with an adherend after being pressurized and fired under conditions of a temperature of 350° C. and a pressure of 10 MPa for 3 minutes in a state in which the film-shaped firing material is in contact with the adherend is 90% or greater with respect to a contact area of the adherend.

[2] The film-shaped firing material according to [1], in which an arithmetic average roughness (Ra) of at least one surface of the film-shaped firing material is 0.5 µm or less.

[3] The film-shaped firing material according to [1] or [2], in which an adhesive force of the film-shaped firing material before being fired to a silicon wafer is 0.2 mN/25 mm or greater.

[4] A film-shaped firing material with a support sheet including: the film-shaped firing material according to any one of [1] to [3]; and a support sheet which is provided on at least one side of the film-shaped firing material.

[5] The film-shaped firing material with a support sheet according to [4], in which the support sheet includes a base film and a pressure-sensitive adhesive layer provided on the base film, and the film-shaped firing material is provided on the pressure-sensitive adhesive layer.

Advantageous Effects of Invention

According to the present invention, it is possible to provide a film-shaped firing material which has excellent thickness stability and in which chip shift before the firing and chip peeling after the firing are unlikely to occur at the time of use for bonding chips to a substrate. Further, it is also possible to provide a film-shaped firing material with a support sheet which includes the film-shaped firing material and is used for sinter bonding of chips of a semiconductor element or the like.

BEST MODE FOR CARRYING OUT THE INVENTION

Hereinafter, an embodiment of the present invention will be appropriately described with reference to the accompanying drawings.

Further, the drawings used in the description below are shown by enlarging main portions for convenience in order to facilitate understanding of the features of the present invention, and the dimensional ratio and the like of each constituent element are not necessarily the same as the actual ratio.

<<Film-Shaped Firing Material>>

A film-shaped firing material according to the present embodiment is a film-shaped firing material which contains sinterable metal particles and a binder component, in which the content of the sinterable metal particles is in a range of 15% to 98% by mass, the content of the binder component is in a range of 2% to 50% by mass, the shrinkage factor in a planar direction of the film-shaped firing material after being pressurized and fired under conditions of a temperature of 350° C. and a pressure of 10 MPa for 3 minutes is 10% or less with respect to the shrinkage factor before the firing, and the volume shrinkage factor thereof is in a range of 15% to 90% with respect to the volume shrinkage factor before the firing, and the contact ratio of the film-shaped firing material with an adherend after being pressurized and fired under conditions of a temperature of 350° C. and a pressure of 10 MPa for 3 minutes in a state in which the film-shaped firing material is in contact with the adherend is 90% or greater with respect to the contact area of the adherend. Here, the content of the sinterable metal particles or the content of the binder component indicates the content thereof with respect to the total mass (100% by mass) of all components other than the solvent in the film-shaped firing material according to the present embodiment. Further, the total content of the sinterable metal particles and the binder component does not exceed 100% by mass.

In the present invention, the film-shaped firing material indicates the material before being fired unless otherwise specified.

Figure 1:
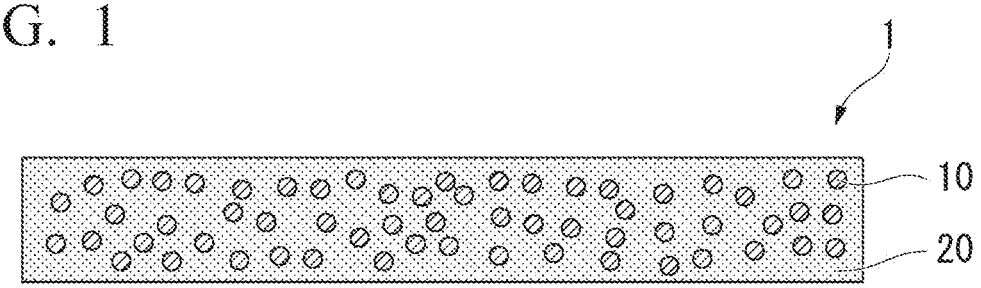
FIG. 1 is a cross-sectional view schematically illustrating a film-shaped firing material according to an embodiment of the present invention.

FIG. 1 is a cross-sectional view schematically illustrating a film-shaped firing material according to the present embodiment. A film-shaped firing material 1 contains sinterable metal particles 10 and a binder component 20.

The film-shaped firing material may be formed of one layer (single layer) or two or more of a plurality of layers, for example, two to ten layers. In a case where the film-shaped firing material is formed of a plurality of layers, the plurality of layers may be the same as or different from one another, and a combination of the plurality of layers is not particularly limited as long as the effects of the present invention are not affected.

Further, in the present specification, the expression "the plurality of layers may be the same as or different from one another" means that "all layers may be the same as one another, all layers may be different from one another, or only some layers may be the same as one another" and the expression "the plurality of layers are different from one another" means that "at least one of the constituent materials of each layer, the compounding ratios of constituent materials, and the thicknesses of layers are different from one another" without limiting to the case of the film-shaped firing material.

The thickness of the film-shaped firing material before being fired is not particularly limited, but is preferably in a range of 10 to 200 μm, preferably in a range of 20 to 150 μm, and more preferably in a range of 30 to 90 μm.

Here, the "thickness of the film-shaped firing material" indicates the thickness of the entire film-shaped firing material. For example, the thickness of the film-shaped firing material formed of a plurality of layers indicates the total thickness of all layers constituting the film-shaped firing material.

In the present specification, the "thickness" can be acquired using a constant pressure thickness-measuring device in conformity with JIS K7130 as a value obtained by averaging the measured thicknesses at five optional sites.

(Release Film)

The film-shaped firing material can be provided in a state of being laminated on a release film. At the time of use, the release film may be peeled off and disposed on an object to which the film-shaped firing material is sinter-bonded. The release film also has a function as a protective film to prevent damage to the film-shaped firing material and adhesion of dirt. The release film may be provided on at least one side of the film-shaped firing material or on both sides of the film-shaped firing material. In a case where the release film is provided on both sides of the film-shaped firing material, the release film on one side functions as a support sheet.

Examples of the release film include transparent films such as a polyethylene film, a polypropylene film, a polybutene film, a polybutadiene film, a polymethyl pentene film, a polyvinyl chloride film, a vinyl chloride copolymer film, a polyethylene terephthalate film, a polyethylene naphthalate film, a polybutylene terephthalate film, a polyurethane film, an ethylene vinyl acetate copolymer film, an ionomer resin film, an ethylene-(meth)acrylic acid copolymer film, an ethylene-(meth)acrylic acid ester copolymer film, a polystyrene film, a polycarbonate film, a polyimide film, and a fluorine resin film. Further, crosslinked films of these can also be used. Further, laminated films of these may also be used. Further, films obtained by coloring these films and opaque films can also be used. Examples of a release agent include a silicone-based release agent, a fluorine-based release agent, an olefin-based release agent, an alkyd-based release agent, and a long-chain alkyl group-containing carbamate.

The thickness of the release film is typically in a range of 10 to 500 μm, preferably in a range of 15 to 300 μm, and particularly preferably in a range of 20 to 250 μm.

<Sinterable Metal Particles>

The sinterable metal particles are metal particles which can be fused and bonded to form a sintered body by being subjected to a heat treatment at a temperature of the melting point of the metal particles or higher as firing of the film-shaped firing material. The formation of the sintered body enables sinter bonding of the film-shaped firing material and a fired product in contact with the film-shaped firing material. Specifically, the chips and the substrate can be sinter-bonded through the film-shaped firing material.

Examples of the metal species of the sinterable metal particles include silver, gold, copper, iron, nickel, aluminum, silicon, palladium, platinum, titanium, barium titanate, and oxides or alloys of these. Among these, silver and silver oxide are preferable. Only one kind of metal or a combination of two or more kinds of metals may be blended into the sinterable metal particles.

It is preferable that the sinterable metal particles be silver nanoparticles which are silver particles having a particle diameter of 100 nm or less, preferably 50 nm or less, and more preferably 20 nm or less.

The particle diameter of the sinterable metal particles contained in the film-shaped firing material is not particularly limited as long as sinterability can be exhibited, but may be 100 nm or less, 50 nm or less, or 30 nm or less. For example, it is preferable that the content of sinterable metal particles having a particle diameter of 100 nm or less be 20% by mass or greater with respect to the total amount of the entire particles. Further, the particle diameter of the sinterable metal particles contained in the film-shaped firing material is set as a projected area circle equivalent diameter of the particle diameter of the sinterable metal particles observed using an electron microscope.

The sinterable metal particles with the particle diameter in the above-described range are preferable from the viewpoint of excellent sinterability.

In the particle diameter of the sinterable metal particles contained in the film-shaped firing material, the number average of the particle diameters acquired using particles whose projected area circle equivalent diameters of the particle diameters of the sinterable metal particles observed using an electron microscope are 100 nm or less may be in a range of 0.1 to 95 nm, in a range of 0.3 to 50 nm, or in a range of 0.5 to 30 nm. Further, the number of sinterable metal particles to be measured is set to 100 or more, for example, 100 particles randomly selected per one film-shaped firing material.

Since the sinterable metal particles are set to be in a state in which aggregates are eliminated in advance before binder components and other additive components described below are mixed with the sinterable metal particles, the sinterable metal particles may be dispersed in a high-boiling-point solvent having a high boiling point such as isobornyl cyclohexanol or decyl alcohol. The boiling point of the high-boiling-point solvent may be, for example, in a range of 200° C. to 350° C. At this time, in a case where the high-boiling-point solvent is used, since the solvent is unlikely to volatilize at room temperature, an increase in concentration of the sinterable metal particles is prevented, the workability is improved, and the re-aggregation and the like of the sinterable metal particles are also prevented so that the quality thereof becomes satisfactory. As the dispersion method, the dispersion may be carried out using a kneader, a triple roll, a bead mill, or ultrasonic waves.

Metal particles (sinterable metal particles) having a particle diameter of 100 nm or less and non-sinterable metal particles having a particle diameter of greater than 100 nm that do not correspond to the metal particles may further be blended into the film-shaped firing material according to the present embodiment. Further, the particle diameter of the non-sinterable metal particles is set as a projected area circle equivalent diameter of the particle diameter of the non-sinterable metal particles observed using an electron microscope. The particle diameter of the non-sinterable metal particles may be, for example, greater than 100 nm and less than or equal to 5000 nm, and it is preferable that the content thereof having a particle diameter of 100 nm to 2500 nm be 5% by mass or greater with respect to the total amount of the entire particles. In the particle diameter of the non-sinterable metal particles having a particle diameter of greater than 100 nm, the number average of the particle diameters acquired using particles whose projected area circle equivalent diameters of the particle diameters of the non-sinterable metal particles observed using an electron microscope are greater than 100 nm may be greater than 150 nm and 50000 nm or less, in a range of 150 to 10000 nm, or in a range of 180 to 5000 nm.

Examples of the metal species of the non-sinterable metal particles having a particle diameter of greater than 100 nm are the same as those exemplified as the metal species of the sinterable metal particles. Among these, silver, copper, and oxides of these are preferable.

The sinterable metal particles having a particle diameter of 100 nm or less and the non-sinterable metal particles having a particle diameter of greater than 100 nm may be the metal species which are the same as or different from each other. For example, the sinterable metal particles having a particle diameter of 100 nm or less may be silver particles and the non-sinterable metal particles having a particle diameter of greater than 100 nm may be silver particles or silver oxide particles. For example, the sinterable metal particles having a particle diameter of 100 nm or less may be silver particles or silver oxide particles and the non-sinterable metal particles having a particle diameter of greater than 100 nm may be copper particles or copper oxide particles.

In the film-shaped firing material according to the present embodiment, the content of the sinterable metal particles may be in a range of 10% to 100% by mass or may be in a range of 20% to 95% by mass with respect to the total mass (100% by mass) of all metal particles.

The surface of the sinterable metal particle and/or the surface of the non-sinterable metal particle may be coated with an organic substance. In a case where the film-shaped firing material has a film coated with an organic substance, the compatibility with a binder component is improved. Further, aggregation of particles can be prevented, and the particles can be uniformly dispersed.

In a case where the surface of the sinterable metal particle and/or the surface of the non-sinterable metal particle is coated with an organic substance, the mass of the sinterable metal particle and the non-sinterable metal particle is set as a value of the mass including the coated substance.

<Binder Component>

In a case where a binder component is blended into the film-shaped firing material, the firing material can be formed in a film shape, and tackiness can be imparted to the film-shaped firing material before being fired. The binder component may be thermally decomposable, that is, thermally decomposed by being subjected to a heat treatment as firing of the film-shaped firing material.

The binder component is not particularly limited, and suitable examples of the binder component include resins. Examples of the resins include an acrylic resin, a polycarbonate resin, polylactic acid, and a polymer of a cellulose derivative. Among these, an acrylic resin is preferable. The acrylic resin includes a homopolymer of a (meth)acrylate compound, two or more copolymers of a (meth)acrylate compound, and a copolymer of a (meth)acrylate compound and another copolymer monomer.

The content of the constituent unit derived from the (meth)acrylate compound in the resin constituting the binder component is preferably in a range of 50% to 100% by mass, more preferably in a range of 80% to 100% by mass, and still more preferably in a range of 90% to 100% by mass with respect to the total mass (100% by mass) of the constituent units.

Here, the term "derived" means that the monomer has undergone a structural change necessary for polymerization.

Specific examples of the (meth)acrylate compound include alkyl (meth)acrylate such as methyl (meth)acrylate, ethyl (meth)acrylate, propyl (meth)acrylate, isopropyl (meth)acrylate, butyl (meth)acrylate, isobutyl (meth)acrylate, t-butyl (meth)acrylate, pentyl (meth)acrylate, amyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, or isostearyl (meth)acrylate;

hydroxyalkyl (meth)acrylate such as hydroxyethyl (meth)acrylate, 2-hydroxypropyl (meth)acrylate, 4-hydroxybutyl (meth)acrylate, 3-hydroxypropyl (meth)acrylate, 2-hydroxybutyl (meth)acrylate or 3-hydroxybutyl (meth)acrylate;

phenoxyalkyl (meth)acrylate such as phenoxyethyl (meth)acrylate, 2-hydroxy-3-phenoxypropyl (meth)acrylate;

alkoxyalkyl (meth)acrylate such as 2-methoxyethyl (meth)acrylate, 2-ethoxyethyl (meth)acrylate, 2-propoxyethyl (meth)acrylate, 2-butoxyethyl (meth)acrylate, or 2-methoxybutyl (meth)acrylate;

polyalkylene glycol (meth)acrylate such as polyethylene glycol mono(meth)acrylate, ethoxy diethylene glycol (meth)acrylate, methoxy polyethylene glycol (meth)acrylate, phenoxy polyethylene glycol (meth)acrylate, nonyl phenoxy polyethylene glycol (meth)acrylate, polypropylene glycol mono(meth)acrylate, methoxy polypropylene glycol (meth)acrylate, ethoxy polypropylene glycol (meth)acrylate, or nonyl phenoxy polypropylene glycol (meth)acrylate;

cycloalkyl (meth)acrylate such as cyclohexyl (meth)acrylate, 4-butyl cyclohexyl (meth)acrylate, dicyclopentanyl (meth)acrylate, dicyclopentenyl (meth)acrylate, dicyclopentadienyl (meth)acrylate, bornyl (meth)acrylate, isobornyl (meth)acrylate, or tricyclodecanyl (meth)acrylate; and benzyl (meth)acrylate, and tetrahydrofurfuryl (meth)acrylate. Among these, alkyl (meth)acrylate or alkoxyalkyl (meth)acrylate is preferable. As a particularly preferable (meth)acrylate compound, butyl (meth)acrylate, ethylhexyl (meth)acrylate, lauryl (meth)acrylate, isodecyl (meth)acrylate, 2-ethylhexyl (meth)acrylate, and 2-ethoxyethyl (meth)acrylate are exemplified.

In the present specification, "(meth)acrylate" includes both of "acrylate" and "methacrylate".

As an acrylic resin, methacrylate is preferable. In a case where the binder component has a constituent unit derived from methacrylate, the film-shaped firing material can be fired at a relatively low temperature, and the conditions for sufficiently obtaining the adhesive strength after the material is sintered can be easily satisfied.

The content of the constituent unit derived from methacrylate in the resin constituting the binder component is preferably in a range of 50% to 100% by mass, more preferably in a range of 80% to 100% by mass, and still more preferably in a range of 90% to 100% by mass with respect to the total mass (100% by mass) of the constituent units.

Another copolymer monomer is not particularly limited as long as the compound can be copolymerized with the (meth)acrylate compound, and examples thereof include unsaturated carboxylic acids such as (meth)acrylic acid, vinyl benzoic acid, maleic acid, and vinyl phthalic acid; and a vinyl group-containing radically polymerizable compound such as vinyl benzyl methyl ether, vinyl glycidyl ether, styrene, α-methylstyrene, butadiene, or isoprene.

The mass-average molecular weight (Mw) of the resin constituting the binder component is preferably in a range of 1000 to 1000000 and more preferably in a range of 10000 to 800000. In a case where the mass-average molecular weight of the resin is in the above-described range, the film exhibits sufficient film hardness, and the flexibility can be easily imparted to the film.

In the present specification, the "mass-average molecular weight" is a value in terms of polystyrene which is measured according to the gel permeation chromatography (GPC) method unless otherwise specified.

The glass transition temperature (Tg) of the resin constituting the binder component is preferably in a range of −60° C. to 50° C., more preferably in a range of −30° C. to 10° C., and still more preferably −20° C. or higher and lower than 0° C. In a case where the Tg of the resin is lower than or equal to the above-described upper limit, the adhesive force before the firing between the film-shaped firing material and the adherend (for example, a chip or a substrate) is improved. As a result, chip shift is unlikely to occur while the chip and the substrate are transported in a state in which the chip and the substrate are temporarily fixed by the film-shaped firing material before being fired. In addition, the flexibility of the film-shaped firing material is improved. Further, in a case where the Tg of the resin is higher than or equal to the above-described lower limit, the film shape can be maintained, and the film-shaped firing material is more easily pulled apart from the support sheet or the like.

In the present specification, "the glass transition temperature (Tg)" is a temperature of an inflection point of a DSC curve obtained by measuring the DSC curve of a sample using a differential scanning calorimeter.

The binder component may be thermally decomposable, that is, thermally decomposed by being subjected to a heat treatment as firing of the film-shaped firing material. The thermal decomposition of the binder component can be confirmed from a decrease in mass of the binder component due to firing. Further, a component to be blended as the binder component may be almost thermally decomposed due to firing, but the entire component to be blended as the binder component may not be thermally decomposed due to firing.

The mass of the binder component after being fired may be 10% by mass or less, 5% by mass or less, 3% by mass or less, or 0% by mass with respect to the total mass (100% by mass) of the binder component before being fired.

In addition to the sinterable metal particles, the non-sinterable metal particles, and the binder component, the film-shaped firing material according to the present embodiment may contain other additives that do not correspond to the sinterable metal particles, the non-sinterable metal particles, and the binder component, within a range where the effects of the present invention are not affected.

Examples of other additives which may be contained in the film-shaped firing material according to the present embodiment include a solvent, a dispersant, a plasticizer, a tackifier, a storage stabilizer, an antifoaming agent, a thermal decomposition accelerator, and an antioxidant. The film-shaped firing material may contain only one or two or more kinds of additives. These additives are not particularly limited and can be appropriately selected from those which have been typically used in this field.

<Composition>

The film-shaped firing material according to the present embodiment may be formed of the sinterable metal particles, the binder component, and other additives, and the total content (% by mass) of these is 100% by mass.

In a case where the film-shaped firing material according to the present embodiment contains the non-sinterable metal particles, the film-shaped firing material may be formed of the sinterable metal particles, the non-sinterable metal particles, the binder component, and other additives, and the total content (% by mass) of these is 100% by mass.

The content of the sinterable metal particles in the film-shaped firing material is in a range of 15% to 98% by mass, more preferably in a range of 15% to 90% by mass, and still more preferably in a range of 20% to 80% by mass with respect to the total mass (100% by mass) of all components other than the solvent (hereinafter, also noted as the "solid content"). In a case where the content of the sinterable metal particles is less than or equal to the above-described upper limit, the content of the binder component can be sufficiently ensured, and thus the film shape can be maintained. Meanwhile, in a case where the content of the sinterable metal particles is greater than or equal to the above-described lower limit, the sinterable metal particles or the sinterable metal particles and the non-sinterable metal particles are fused at the time of being fired so that high bonding adhesive strength (shear adhesive force) is exhibited after the particles are fired.

In a case where the film-shaped firing material contains the non-sinterable metal particles, the total content of the sinterable metal particles and the non-sinterable metal particles is preferably in a range of 50% to 98% by mass, more preferably in a range of 70% to 95% by mass, and still more preferably in a range of 80% to 90% by mass with respect to the total mass (100% by mass) of the solid content in the film-shaped firing material.

The content of the binder component is in a range of 2% to 50% by mass, preferably in a range of 5% to 30% by mass, and more preferably in a range of 5% to 20% by mass with respect to the total mass (100% by mass) of the solid content in the film-shaped firing material. In a case where the content of the binder component is less than or equal to the above-described upper limit, the content of the sinterable metal particles can be sufficiently ensured, and thus the bonding adhesive force between the film-shaped firing material and the adherend is improved. Therefore, chip peeling is unlikely to occur at the time of use of the material for bonding the chip to the substrate. In a case where the content of the binder component is greater than or equal to the above-described lower limit, the film shape can be maintained. In addition, chip shift is unlikely to occur while the chip and the substrate are transported in a state in which the chip and the substrate are temporarily fixed by the film-shaped firing material before being fired.

The mass ratio (sinterable metal particles:binder component) of the sinterable metal particles to the binder component in the film-shaped firing material is preferably in a range of 50:1 to 1:5, more preferably in a range of 20:1 to 1:2, and still more preferably in a range of 10:1 to 1:1. In a case where the film-shaped firing material contains the non-sinterable metal particles, the mass ratio ((sinterable metal particles+non-sinterable metal particles):binder component) of the sinterable metal particles and the non-sinterable metal particles to the binder component is preferably in a range of 50:1 to 1:1, more preferably in a range of 20:1 to 2:1, and still more preferably in a range of 9:1 to 4:1.

The film-shaped firing material may contain the above-described high-boiling-point solvent used at the time of mixing the sinterable metal particles, the non-sinterable metal particles, the binder component, and other additive components. The content of the high-boiling-point solvent is preferably 20% by mass or less, more preferably 15% by mass or less, and still more preferably 10% by mass or less with respect to the total mass (100% by mass) of the film-shaped firing material.

<Shrinkage Factor in Planar Direction>

A shrinkage factor (A) in the planar direction of the film-shaped firing material according to the present embodiment after being pressurized and fired under conditions of a temperature of 350° C. and a pressure of 10 MPa for 3 minutes is 10% or less with respect to the shrinkage factor before the firing. The shrinkage factor (A) is preferably 5% or less, more preferably 3% or less, and most preferably 0% (that is, the film-shaped firing material is not shrunk in the planar direction even after being pressurized and fired). In a case where the shrinkage factor (A) is less than or equal to the above-described upper limit, chip peeling is unlikely to occur under various conditions at the time of use for bonding the chip to the substrate. Here, the "various conditions" include a high-humidity environment, a high-temperature environment, a high-humidity and high-temperature environment, a low-temperature environment, and an environment where a high temperature and a low temperature are repeated.

The shrinkage factor (A) is acquired according to Equation (I).

$$\text{Shrinkage factor}(A) = \{1-(\text{area of shape of film-shaped firing material after being fired in plan view}/\text{area of shape of film-shaped firing material before being fired in plan view})\} \times 100 \quad (I)$$

The shrinkage factor (A) can be controlled by the content of the binder component and the sinterable metal particles contained in the film-shaped firing material. Specifically, the shrinkage factor (A) tends to decrease as the content of the sinterable metal particles is increased and the content of the binder component is decreased.

<Volume Shrinkage Factor>

A volume shrinkage factor (B) of the film-shaped firing material according to the present embodiment after being pressurized and fired under conditions of a temperature of 350° C. and a pressure of 10 MPa for 3 minutes is in a range of 15% to 90% with respect to the volume shrinkage factor before the firing. The volume shrinkage factor (B) is preferably in a range of 30% to 80%, more preferably in a range of 40% to 70%, and still more preferably in a range of 50% to 60%. In a case where the volume shrinkage factor (B) is less than or equal to the above-described upper limit, chip peeling is unlikely to occur at the time of use for bonding the chip to the substrate. Meanwhile, in a case where the volume shrinkage factor (B) is greater than or equal to the above-described lower limit, the binder component which is the main factor of the volume shrinkage is sufficiently contained in the film-shaped firing material.

Therefore, chip shift is unlikely to occur while the chip and the substrate are transported in a state in which the chip and the substrate are temporarily fixed by the film-shaped firing material before being fired.

The volume shrinkage factor (B) is acquired according to Equation (II).

$$\text{Volume shrinkage factor}(B) = \{1 - (\text{volume of film-shaped firing material after being fired/volume of film-shaped firing material before being fired})\} \times 100 \qquad \text{(II)}$$

The volume shrinkage factor (B) can be controlled by the content of the binder component and the sinterable metal particles contained in the film-shaped firing material. Specifically, the volume shrinkage factor (B) tends to decrease as the content of the sinterable metal particles is increased and the content of the binder component is decreased. Further, the volume shrinkage factor (B) tends to increase as the content of the sinterable metal particles is decreased and the content of the binder component is increased.

<Contact Ratio>

A contact ratio (C) of the film-shaped firing material according to the present embodiment with an adherend after being pressurized and fired under conditions of a temperature of 350° C. and a pressure of 10 MPa for 3 minutes in a state in which the film-shaped firing material is in contact with the adherend is 90% or greater with respect to the area (contact area) of the adherend to which the film-shaped firing material is attached.

Figure 2:
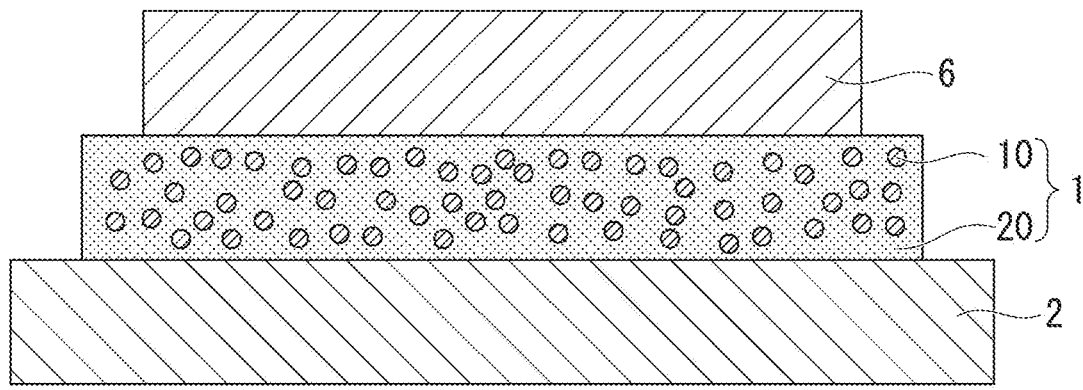
FIG. 2 is a cross-sectional view schematically illustrating a film-shaped firing material in a state of being laminated on an adherend according to an embodiment of the present invention.

For example, in the laminate in which the film-shaped firing material according to the present embodiment and the adherend are laminated as illustrated in FIG. 2, the contact ratio (C) of the film-shaped firing material with the adherend after being pressurized and fired under conditions of a temperature of 350° C. and a pressure of 10 MPa for 3 minutes is 90% or greater with respect to the area (contact area) of the adherend to which the film-shaped firing material is attached.

The contact ratio (C) is preferably 95% or greater, more preferably 97% or greater, and most preferably 100% (that is, the contact area of the adherend is the same as the area of the contact surface of the film-shaped firing material (sintered body) after being fired, even after being pressurized and fired).

For example, in a case where the substrate and the chip are attached to each other and fired through the firing material and the shrinkage of the firing material is significant, a portion where the firing material or the sintered body thereof is not present is generated in the form of a frame on the rear surface of the chip (that is, the surface in contact with the firing material) or the front surface of the substrate (that is, the surface in contact with the firing material). The adhesiveness between the chip and the substrate is degraded so that chip peeling is likely to occur as the area of the portion where the firing material or the sintered body thereof is not present increases.

In a case where the contact ratio (C) increases, this indicates that the area of the portion where the firing material or the sintered body thereof is not present decreases in the contact area of the adherend. In a case where the contact ratio (C) is greater than or equal to the above-described lower limit, chip peeling is unlikely to occur at the time of use for bonding the chip to the substrate.

Further, examples of the adherend include a chip and a substrate.

The contact ratio (C) is acquired, for example, in the following manner.

First, the chip and the substrate are attached to each other through the film-shaped firing material and pressurized and fired under conditions of a temperature of 350° C. and a pressure of 10 MPa for 3 minutes.

Next, the chip is peeled off from the substrate by applying a force to the interface between the chip and the substrate in the shear direction.

In a case where the peeling occurs at the interface between the chip and the film-shaped firing material, the area of the adhesion mark of the film-shaped firing material on the surface of the chip (that is, the surface of the chip onto which the film-shaped firing material is attached) is measured, and the area is set as the area of the film-shaped firing material after being fired.

In a case where cohesive fracture occurs in the film-shaped firing material, the thickness of the film-shaped firing material remaining on the surface of the chip is reduced to 20 μm or less, and the area of the film-shaped firing material is measured. This area is set as the area of the film-shaped firing material after being fired.

Further, voids are generated in a case where the film-shaped firing material is fired. In a case where voids or marks thereof are found during the measurement of the area of the film-shaped firing material after being fired, the area of the voids was not included in the area of the film-shaped firing material after being fired.

The contact ratio (C) is acquired according to Equation (III).

$$\text{Contact ratio}(C) = (\text{area of film-shaped firing material (sintered body) after being fired/area of surface of chip onto which film-shaped firing material is attached}) \times 100 \qquad \text{(III)}$$

The contact ratio (C) can be controlled by the content of the binder component and the sinterable metal particles contained in the film-shaped firing material. Specifically, the contact ratio (C) tends to increase as the content of the sinterable metal particles is increased and the content of the binder component is decreased.

<Arithmetic Average Roughness>

The arithmetic average roughness (Ra) of at least one surface of the film-shaped firing material according to the present embodiment is preferably 0.5 μm or less. The arithmetic average roughness (Ra) thereof is preferably 0.4 μm or less, more preferably 0.3 μm or less, and still more preferably 0.25 μm or less. In a case where the arithmetic average roughness (Ra) is less than or equal to the above-described upper limit, the contact area with the adherend is increased, and thus the adhesive force to the adherend tends to increase. The lower limit of the arithmetic average roughness (Ra) is typically 0.05 μm.

The arithmetic average roughness (Ra) may be in a range of 0.05 to 0.5 μm, in a range of 0.05 to 0.4 μm, in a range of 0.05 to 0.3 μm, or in a range of 0.05 to 0.25 μm.

The arithmetic average roughness (Ra) is acquired in conformity with JIS B0601:2001, and the details of the measurement method thereof are as described in the test example described below.

In a case where the film-shaped firing material is used for bonding the chip to the substrate, it is preferable that the surface having an arithmetic average roughness (Ra) of 0.5 μm or less become a surface which is brought into contact with a semiconductor wafer or a chip. In other words, the arithmetic average roughness (Ra) of the surface of the film-shaped firing material on a side where the film-shaped firing material is in contact with the semiconductor wafer or the chip is preferably 0.5 μm or less.

In a case where the arithmetic average roughness (Ra) of the surface of the film-shaped firing material on a side where the film-shaped firing material is in contact with the semiconductor wafer or the chip is 0.5 μm or less, the semiconductor wafer or the chip sufficiently adheres to the film-shaped firing material, and chip shift is unlikely to occur at the time of the transport of the chip and the substrate in a state in which the chip and the substrate are temporarily fixed by the film-shaped firing material before being fired.

<Adhesive Force>

An adhesive force (D) of the film-shaped firing material according to the present embodiment to a silicon wafer before the firing is preferably 0.2 mN/25 mm or greater. The adhesive force (D) thereof is more preferably 0.5 mN/25 mm or greater and still more preferably 1.0 mN/25 mm or greater. In a case where the adhesive force (D) is greater than or equal to the above-described lower limit, chip shift is unlikely to occur at the time of the transport of the chip and the substrate in a state in which the chip and the substrate are temporarily fixed by the film-shaped firing material before being fired.

The adhesive force (D) can be measured in conformity with JIS Z 0237:2009, specifically, according to the following method.

First, the surface of the silicon wafer is subjected to a chemical mechanical polishing treatment until the arithmetic average roughness (Ra) reaches 0.02 µm.

The film-shaped firing material prepared on a PET film having a thickness of 50 µm is cut to have a width of 25 mm and a length of 100 mm or greater, and the cut film-shaped firing material is attached to the treated surface of the silicon wafer. During the attachment, the film-shaped firing material may be heated to room temperature or higher. The heating temperature is not particularly limited, but is preferably 100° C. or lower.

Next, the film-shaped firing material is peeled from the silicon wafer at a peeling speed of 300 mm/min. The peeling at this time is set as so-called "180° peeling" in which the film-shaped firing material is peeled off in the length direction thereof such that the angle between the surface of the silicon wafer and the surface of the film-shaped firing material which are in contact with each other reaches 180°. Further, the load (peeling force) during this 180° peeling is measured, and the measured value is set as the adhesive force (D) (mN/25 mm).

According to the film-shaped firing material of the above-described embodiment, the thickness stability is excellent because the material is in the form of a film. Further, since the film-shaped firing material according to the present embodiment contains sinterable metal particles, the thermal conductivity is excellent. Further, the film-shaped firing material according to the present embodiment contains a specific amount of the sinterable metal particles and a specific amount of the binder component, the shrinkage factor (A) is 10% or less with respect to the shrinkage factor (A) before the firing, the volume shrinkage factor (B) is in a range of 15% to 90% with respect to the volume shrinkage factor (B) before the firing, and the contact ratio (C) is 90% or greater with respect to the contact surface of the adherend. Accordingly, chip shift is unlikely to occur during the transport of the chip and the substrate in a state of being temporarily fixed by the film-shaped firing material before the firing. In addition, since chip peeling is unlikely to occur after the firing, long-term use of the device becomes possible.

The film-shaped firing material can be made into a film-shaped firing material with a support sheet provided with a support sheet on at least one side (surface) thereof.

The details of the film-shaped firing material with a support sheet are as follows.

<<Method of Producing Film-Shaped Firing Material>>

The film-shaped firing material can be formed using a firing material composition containing this constituent material.

For example, the film-shaped firing material can be formed in a target portion by coating or printing a surface on which the film-shaped firing material is formed with the firing material composition containing a solvent and each component for constituting the film-shaped firing material and volatilizing the solvent as necessary.

Examples of the surface on which the film-shaped firing material is formed include a surface of a release film.

As the solvent in a case where the surface is coated with the firing material composition, a solvent having a boiling point of lower than 200° C. is preferable. Examples thereof include n-hexane (boiling point: 68° C.), ethyl acetate (boiling point: 77° C.), 2-butanone (boiling point: 80° C.), n-heptane (boiling point: 98° C.), methyl cyclohexane (boiling point: 101° C.), toluene (boiling point: 111° C.), acetyl acetone (boiling point: 138° C.), n-xylene (boiling point: 139° C.), and dimethylformamide (boiling point: 153° C.). These solvents may be used alone or in combination.

The surface thereof may be coated with the firing material composition using a known method, and examples of the method include methods of using various coaters such as an air knife coater, a blade coater, a bar coater, a gravure coater, a Comma coater (registered trademark), a roll coater, a roll knife coater, a curtain coater, a die coater, a knife coater, a screen coater, a Meyer bar coater, and a kiss coater.

In a case where the surface is printed with the firing material composition, the solvent may be volatilized and dried after the printing, and the boiling point thereof is preferably in a range of 65° C. to 350° C. Examples of such a solvent include the above-described solvent having a boiling point of lower than 200° C., isophorone (boiling point: 215° C.), butyl carbitol (boiling point: 230° C.), 1-decanol (boiling point: 233° C.), butyl carbitol acetate (boiling point: 247° C.), and isobornyl cyclohexanol (boiling point: 318° C.).

In a case where the boiling point is higher than 350° C., at the time of volatilizing and drying the solvent after the printing, the solvent is unlikely to be volatilized, and a desired shape is unlikely to be ensured. Further, the solvent at the time of firing the material remains in the film, and thus the bonding adhesiveness may deteriorate. In a case where the boiling point is lower than 65° C., the solvent is volatilized during the printing, and thus the thickness stability may be impaired. In a case where a solvent having a boiling point of 200° C. to 350° C. is used, an increase in viscosity due to the volatilization of the solvent during the printing can be suppressed. Therefore, the printing suitability can be obtained.

The printing of the firing material composition can be performed according to a known printing method, for example, relief printing such as flexo printing, intaglio printing such as gravure printing, planographic printing such as offset printing, screen printing such as silk screen printing or rotary screen printing, or printing using various printers such as an ink jet printer.

The shape of the film-shaped firing material may be appropriately set according to the target shape of sinter bonding, and a circular shape or a rectangular shape is preferable. The circular shape is a shape corresponding to the shape of the semiconductor wafer. The rectangular shape is a shape corresponding to the shape of the chip. The corresponding shape may be the same or approximately the same as the target shape of sinter bonding.

In a case where the film-shaped firing material is a circular shape, the area of the circle may be in a range of 3.5 to 1600 $cm^2$ or may be in a range of 85 to 1400 $cm^2$. In a case where the film-shaped firing material is a rectangular shape, the area of the rectangle may be in a range of 0.01 to 25 cm$^2$ or may be in a range of 0.25 to 9 cm$^2$.

Particularly, the film-shaped firing material having a desired shape is likely to be formed in a case where the firing material composition is printed.

The condition for drying the firing material composition is not particularly limited, but it is preferable that the firing material composition be dried by being heated in a case where the firing material composition contains a solvent. In this case, it is preferable that the firing material composition be dried, for example, in a temperature range of 70° C. to 250° C. or in a temperature range of 80° C. to 180° C. for 10 seconds to 10 minutes.

The film-shaped firing material according to the present embodiment is a film-shaped firing material containing sinterable metal particles and a binder component, in which the content of the sinterable metal particles is in a range of 15% to 98% by mass, the content of the binder component is in a range of 2% to 50% by mass, the shrinkage factor in a planar direction of the film-shaped firing material after being pressurized and fired under conditions of a temperature of 350° C. and a pressure of 10 MPa for 3 minutes is 10% or less with respect to the shrinkage factor before the firing, and the volume shrinkage factor thereof is in a range of 15% to 90% with respect to the volume shrinkage factor before the firing, and the contact ratio of the film-shaped firing material with an adherend after being pressurized and fired under conditions of a temperature of 350° C. and a pressure of 10 MPa for 3 minutes in a state in which the film-shaped firing material is in contact with the adherend is 90% or greater with respect to the contact area of the adherend. Further, a film-shaped firing material containing at least one selected from the group consisting of silver, copper, and oxides thereof as the sinterable metal particles, and a copolymer of a (meth)acrylate compound and another copolymer as the binder component is preferable.

Further, the content of the sinterable metal particles in the film-shaped firing material according to the present embodiment is in a range of 20% to 80% by mass, and the content of the binder component therein is preferably in a range of 5% to 20% by mass.

<<Film-Shaped Firing Material with a Support Sheet>>

A film-shaped firing material with a support sheet according to the present embodiment includes the above-described film-shaped firing material and a support sheet provided on at least one side (surface) of the film-shaped firing material. The support sheet is formed such that a pressure-sensitive adhesive layer is provided on the entire surface or the outer peripheral portion of a base film, and it is preferable that the film-shaped firing material be provided on the pressure-sensitive adhesive layer. The film-shaped firing material may be provided by being brought into direct contact with the pressure-sensitive adhesive layer or provided by being brought into direct contact with the base film. By employing the present form, the material can be used as a dicing sheet used at the time of dividing a semiconductor wafer into chips. Further, the film-shaped firing material having the same shape as the shape of chip can be processed by being divided together with the semiconductor wafer using a blade or the like, and a chip with the film-shaped firing material can be produced.

Hereinafter, an embodiment of the film-shaped firing material with a support sheet will be described.

Figure 3:
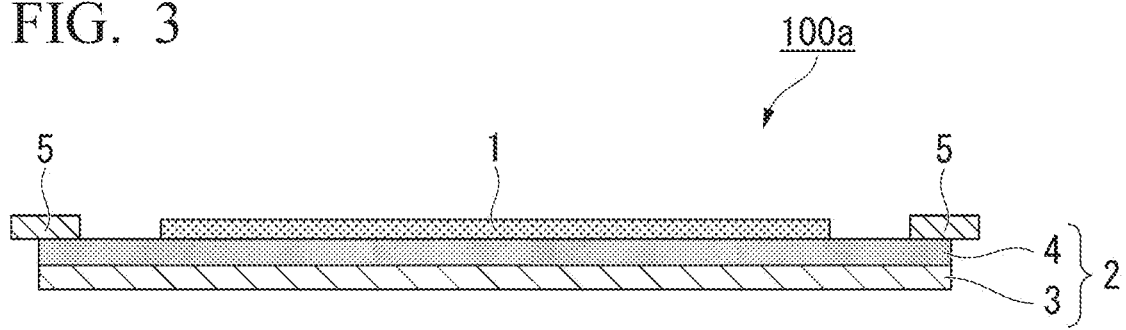
FIG. 3 is a cross-sectional view schematically illustrating a state in which a film-shaped firing material with a support sheet according to an embodiment of the present invention is attached to a ring frame.
Figure 4:
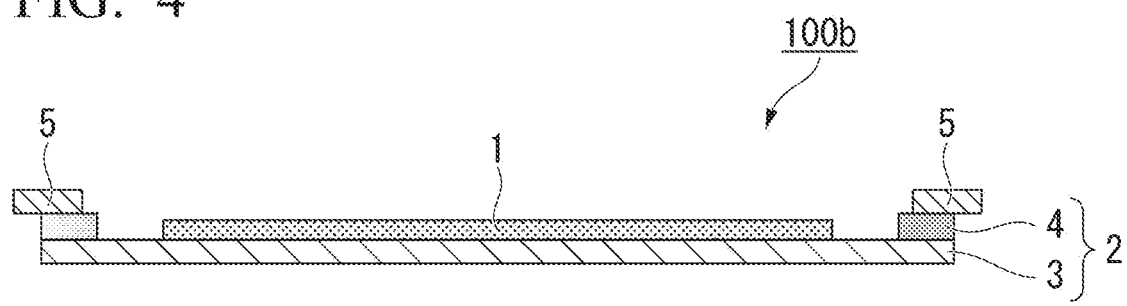
FIG. 4 is a cross-sectional view schematically illustrating a state in which a film-shaped firing material with a support sheet according to an embodiment of the present invention is attached to a ring frame.

FIGS. 3 and 4 are cross-sectional views schematically illustrating the film-shaped firing material with a support sheet according to the present embodiment. As illustrated in FIGS. 3 and 4, film-shaped firing material with a support sheets 100a and 100b according to the present embodiment are formed such that the film-shaped firing material 1 is temporarily and peelably attached to the inner peripheral portion of a support sheet 2 having a pressure-sensitive adhesive portion on the outer peripheral portion. As illustrated in FIG. 3, the support sheet 2 is a pressure-sensitive adhesive sheet having a pressure-sensitive adhesive layer 4 on the upper surface of a base film 3, and the surface of the inner peripheral portion of the pressure-sensitive adhesive layer 4 is covered with the film-shaped firing material to expose the pressure-sensitive adhesive portion to the outer peripheral portion. Further, as illustrated in FIG. 4, the support sheet 2 may include a ring-shaped pressure-sensitive adhesive layer 4 on the outer peripheral portion of the base film 3.

The film-shaped firing material 1 is formed in approximately the same shape as the shape of a workpiece (a semiconductor wafer or the like) to be attached to the inner peripheral portion of the support sheet 2. The support sheet 2 has a pressure-sensitive adhesive portion on the outer peripheral portion. According to a preferable aspect, the film-shaped firing material 1 having a diameter smaller than the diameter of the support sheet 2 is concentrically laminated on the circular support sheet 2. The pressure-sensitive adhesive portion on the outer peripheral portion is used for fixing a ring frame 5 as illustrated in the figure.

(Base Film)

The base film 3 is not particularly limited, and examples thereof include films formed of low density polyethylene (LDPE), linear low density polyethylene (LLDPE), an ethylene-propylene copolymer, polypropylene, polybutene, polybutadiene, polymethylpentene, an ethylene-vinyl acetate copolymer, an ethylene-(meth)acrylic acid copolymer, an ethylene-methyl (meth)acrylate copolymer, an ethylene-ethyl (meth)acrylate copolymer, polyvinyl chloride, a vinyl chloride-vinyl acetate copolymer, a polyurethane film, and an ionomer. In the present specification, "(meth)acryl" includes both acryl and methacryl.

Further, in a case where the support sheet is required to have high heat resistance, examples of the base film 3 include a polyester film such as polyethylene terephthalate, polybutylene terephthalate, or polyethylene naphthalate, and a polyolefin film such as polypropylene or polymethyl pentene. In addition, crosslinked films of these or modified films using radiation, electric discharge, and the like can also be used. The base film may be a laminate of the above-described films.

Further, these films can be used by laminating two or more films thereof or by combining the films. Further, films obtained by coloring these films or performing printing thereon can also be used. Further, the films may be formed into a sheet by performing extrusion molding a thermoplastic resin or may be stretched. Further, films formed into a sheet by thinning and curing a curable resin through predetermined means may be used.

The thickness of the base film is not particularly limited, but is preferably in a range of 30 to 300 μm and more preferably in a range of 50 to 200 μm. By setting the thickness of the base film to be in the above-described range, rupture of the base film is unlikely to occur even in a case where cutting is performed by means of dicing. Further, since the flexibility is sufficiently imparted to the film-shaped firing material with a support sheet, the film-shaped firing material exhibits satisfactory adhesiveness to a workpiece (for example, a semiconductor wafer).

The base film can be obtained by coating the surface with a release agent and performing a peeling treatment. As the release agent used for the peeling treatment, an alkyd-based release agent, a silicone-based release agent, a fluorine-based release agent, an unsaturated polyester-based release agent, a polyolefin-based release agent, or a wax-based release agent is used. Among these, from the viewpoint of heat resistance, an alkyd-based release agent, a silicone-based release agent, or a fluorine-based release agent is particularly preferable.

In order to perform the peeling treatment on the surface of the base film using the release agent, the surface thereof is coated with the release agent in the absence of a solvent or after being diluted with a solvent or emulsified, using a gravure coater, a Meyer bar coater, an air knife coater, or a roll coater, and the base film coated with the release agent is provided at room temperature or under a heating condition or may be cured by electron beams to form a laminate through wet lamination, dry lamination, hot melt lamination, melt extrusion lamination, or coextrusion process.

(Pressure-Sensitive Adhesive Layer)

The support sheet 2 has a pressure-sensitive adhesive portion on at least the outer peripheral portion thereof. It is preferable that the pressure-sensitive adhesive portion have a function of temporarily fixing the ring frame 5 on the outer peripheral portions of film-shaped firing material with a support sheet 100a and 100b, and the ring frame 5 be peelable after required steps are carried out. Therefore, as the pressure-sensitive adhesive layer 4, a layer with low tackiness may be used, or an energy ray-curable layer having an adhesive force which is decreased at the time of irradiation with energy rays may be used. A repeelable pressure-sensitive adhesive layer can be formed using various known pressure-sensitive adhesives (for example, a general purpose pressure-sensitive adhesive such as a rubber-based pressure-sensitive adhesive, an acrylic pressure-sensitive adhesive, a silicone-based pressure-sensitive adhesive, a urethane-based pressure-sensitive adhesive, or a polyvinyl ether-based pressure-sensitive adhesive, a pressure-sensitive adhesive with surface unevenness, an energy ray-curable pressure-sensitive adhesive, or a thermal expansion component-containing pressure-sensitive adhesive).

The support sheet 2 is a pressure-sensitive adhesive sheet having a typical configuration provided with the pressure-sensitive adhesive layer 4 on the entire upper surface of the base film 3 as illustrated in FIG. 3. Alternatively, the support sheet may have a configuration in which the surface of the pressure-sensitive adhesive layer 4 on the inner peripheral portion is covered with the film-shaped firing material and the pressure-sensitive adhesive portion is exposed to the outer peripheral portion. In this case, the outer peripheral portion of the pressure-sensitive adhesive layer 4 is used for fixing the above-described ring frame 5, and the film-shaped firing material is peelably laminated on the inner peripheral portion. As the pressure-sensitive adhesive layer 4, a layer with low tackiness may be used in the same manner as described above, or an energy ray-curable pressure-sensitive adhesive may be used.

In the configuration illustrated in FIG. 4, the ring-shaped pressure-sensitive adhesive layer 4 is formed on the outer peripheral portion of the base film 3 and is set as a pressure-sensitive adhesive portion. At this time, the pressure-sensitive adhesive layer 4 may be a single pressure-sensitive adhesive layer formed of the above-described pressure-sensitive adhesive or may be obtained by circularly cutting double-sided pressure-sensitive adhesive tape containing a pressure-sensitive adhesive layer formed of the above-described pressure-sensitive adhesive.

As a weak pressure-sensitive adhesive, an acrylic pressure-sensitive adhesive or a silicone-based pressure-sensitive adhesive is preferably used. Further, in consideration of the peelability of the film-shaped firing material, the adhesive force of the pressure-sensitive adhesive layer 4 on a SUS plate at 23° C. is preferably in a range of 30 to 120 mN/25 mm, more preferably in a range of 50 to 100 mN/25 mm, and still more preferably in a range of 60 to 90 mN/25 mm. In a case where the adhesive force is extremely low, the ring frame may drop off. Further, in a case where the adhesive force is extremely high, the pressure-sensitive adhesive layer 4 is unlikely to be peeled off from the ring frame, and thus the ring frame is unlikely to be reused.

In a case where a repeelable pressure-sensitive adhesive layer which is curable by energy rays is used in the support sheet with the configuration of FIG. 3, the tackiness may be decreased by irradiating a region where the film-shaped firing material is laminated with energy rays in advance. At this time, the adhesive force in other regions may be maintained to be high without performing irradiation with energy rays for the purpose of bonding the ring frame 5. In order to not irradiate other regions with energy rays, for example, irradiation with energy rays may be performed from the base film side by providing an energy ray shielding layer in regions corresponding to other regions of the base film through printing or the like. In the support sheet with the configuration of FIG. 3, the surface where the pressure-sensitive adhesive layer 4 of the base film 3 is provided can be subjected to a roughening treatment such as sand blasting or a solvent treatment or an oxidation treatment such as a corona discharge treatment, irradiation with electron beams, a plasma treatment, an ozone ultraviolet irradiation treatment, a flame treatment, a chromic acid treatment or an hot air treatment as desired, for the purpose of strengthening bonding between the base film 3 and the pressure-sensitive adhesive layer 4. In addition, a primer treatment can be performed.

The thickness of the pressure-sensitive adhesive layer 4 is not particularly limited, but is preferably in a range of 1 to 100 μm, more preferably in a range of 2 to 80 μm, and particularly preferably in a range of 3 to 50 μm.

(Film-Shaped Firing Material with a Support Sheet)

The film-shaped firing material with a support sheet is formed such that the film-shaped firing material is temporarily and peelably attached to the inner peripheral portion of a support sheet having a pressure-sensitive adhesive portion on the outer peripheral portion. In the configuration example illustrated in FIG. 3, the film-shaped firing material with a support sheet 100a is formed such that the film-shaped firing material 1 is peelably laminated on the inner peripheral portion of the support sheet 2 formed of the base film 3 and the pressure-sensitive adhesive layer 4, and the pressure-sensitive adhesive layer 4 is exposed to the outer peripheral portion of the support sheet 2. In this configuration example, it is preferable that the film-shaped firing material 1 having a diameter smaller than the diameter of the support sheet 2 be concentrically and peelably laminated on the pressure-sensitive adhesive layer 4 of the support sheet 2.

The film-shaped firing material with a support sheet 100a having the above-described configuration is attached to the ring frame 5 in the pressure-sensitive adhesive layer 4 exposed to the outer peripheral portion of the support sheet 2.

Further, cyclic double-sided tape or a pressure-sensitive adhesive layer may be separately provided on the paste (the pressure-sensitive adhesive layer exposed to the outer peripheral portion of the pressure-sensitive adhesive sheet)

with respect to the ring frame. The double-sided tape has a configuration of a pressure-sensitive adhesive layer, a core material, and a pressure-sensitive adhesive layer, and the pressure-sensitive adhesive layer in the double-sided tape is not particularly limited, and a pressure-sensitive adhesive such as a rubber-based pressure-sensitive adhesive, an acrylic pressure-sensitive adhesive, a silicone-based pressure-sensitive adhesive, or polyvinyl ether is used. The pressure-sensitive adhesive layer is attached to the ring frame on the outer peripheral portion at the time of production of a substrate with a chip described below. Preferred examples of the core material of the double-sided tape include a polyester film, a polypropylene film, a polycarbonate film, a polyimide film, a fluorine resin film, and a liquid crystal polymer film.

Figure 5:
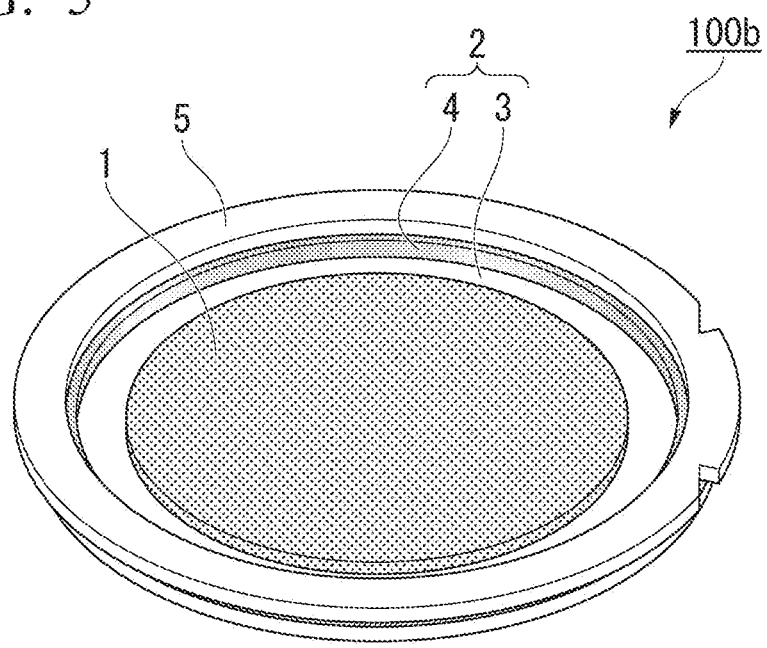
FIG. 5 is a perspective view schematically illustrating a state in which a film-shaped firing material with a support sheet according to an embodiment of the present invention is attached to a ring frame.

In the configuration example illustrated in FIG. 4, the ring-shaped pressure-sensitive adhesive layer 4 is formed on the outer peripheral portion of the base film 3 and is set as a pressure-sensitive adhesive portion. FIG. 5 is a perspective view illustrating the film-shaped firing material with a support sheet 100b illustrated in FIG. 4. At this time, the pressure-sensitive adhesive layer 4 may be a single pressure-sensitive adhesive layer formed of the pressure-sensitive adhesive or may be obtained by circularly cutting double-sided pressure-sensitive adhesive tape containing a pressure-sensitive adhesive layer formed of the pressure-sensitive adhesive. The film-shaped firing material 1 is peelably laminated on the inner peripheral portion of the base film 3 enclosed by the pressure-sensitive adhesive portion. In this configuration example, it is preferable that the film-shaped firing material 1 having a diameter smaller than the diameter of the support sheet be is concentrically and peelably laminated on the base film 3 of the support sheet 2.

A release film may be provided on the film-shaped firing material with a support sheet for the purpose of surface protection in order to avoid contact of any one or both surfaces of the film-shaped firing material and the pressure-sensitive adhesive portion with the outside until the material is provided for use.

The surface protective film (release film) can be obtained by performing the above-described peeling treatment on the surface of the base film such as polyethylene, polyethylene terephthalate, polybutylene terephthalate, polyethylene naphthalate, or polypropylene using a release agent. Examples of the release agent used for the peeling treatment include the release agents exemplified in the section of the base film.

The thickness of the film-shaped firing material with a support sheet is preferably in a range of 1 to 500 μm, more preferably in a range of 5 to 300 μm, and still more preferably in a range of 10 to 150 μm.

Here, the "thickness of the film-shaped firing material with a support sheet" indicates the thickness of the entire film-shaped firing material with a support sheet. For example, the thickness of the film-shaped firing material with a support sheet formed of a plurality of layers indicates the total thickness of all layers constituting the film-shaped firing material with a support sheet.

<<Method of Producing Film-Shaped Firing Material with a Support Sheet>>

The film-shaped firing material with a support sheet can be produced by sequentially laminating the above-described respective layers so as to have the corresponding positional relationship.

For example, in a case where the pressure-sensitive adhesive layer or the film-shaped firing material is laminated on the base film, the release film is coated or printed with the pressure-sensitive adhesive composition or firing material composition containing a component and a solvent for constituting the pressure-sensitive adhesive layer or the film-shaped firing material, the composition is dried as necessary to volatilize the solvent and obtain a film shape, the pressure-sensitive adhesive layer or the film-shaped firing material is formed on the release film in advance, and the surface of the base film is attached to the surface of the pressure-sensitive adhesive layer or film-shaped firing material after completion of the above-described formation on a side opposite to a side where the release film is provided. At this time, it is preferable that the surface of the release film on which the peeling treatment has been performed be coated or printed with the pressure-sensitive adhesive composition or firing material composition. The release film may be removed after formation of the laminated structure as necessary. The total content of the respective components for constituting the pressure-sensitive adhesive composition or the firing material composition may be in a range of 50% to 99% by mass, and the content of the solvent may be in a range of 1% to 50% by mass.

For example, in a case where a film-shaped firing material with a support sheet (a film-shaped firing material with a support sheet, in which the support sheet is a laminate of the base film and the pressure-sensitive adhesive layer) formed by laminating the pressure-sensitive adhesive layer on the base film and laminating the film-shaped firing material on the pressure-sensitive adhesive layer is produced, the pressure-sensitive adhesive layer is laminated on the base film according to the above-described method, the release film is separately coated or printed with the firing material composition containing a component and a solvent for constituting the film-shaped firing material, the composition is dried as necessary to volatilize the solvent and obtain a film shape so that the film-shaped firing material is formed on the release film, the exposed surface of this film-shaped firing material is attached to the exposed surface of the pressure-sensitive adhesive layer after being laminated on the base material, and the film-shaped firing material is laminated on the pressure-sensitive adhesive layer, thereby obtaining a film-shaped firing material with a support sheet. Even in a case where the film-shaped firing material is formed on the release film, it is preferable that the surface of the release film on which the peeling treatment has been performed be coated or printed with the firing material composition, and the release film may be removed after formation of the laminated structure as necessary.

As described above, since all layers other than the base material constituting the film-shaped firing material with a support sheet can be formed on the release film in advance and laminated using a method of bonding the layers to the surface of a target layer, the film-shaped firing material with a support sheet may be produced by appropriately selecting a layer that employs such a step as necessary.

Further, the film-shaped firing material with a support sheet may be stored in a state in which all the required layers are provided and then the release film is attached to the surface of the outermost layer on a side opposite to the support sheet.

<<Method of Producing Substrate with Chip>>

Next, a method of utilizing the film-shaped firing material with a support sheet according to the present invention will be described based on an example of a case where the firing material is used for production of a substrate with a chip.

According to the embodiment of the present invention, the method of producing a substrate with a chip obtained by using the film-shaped firing material with a support sheet is performed by peeling the release film off from the film-shaped firing material with a support sheet and attaching the film-shaped firing material with a support sheet to the rear surface of a semiconductor wafer (workpiece). The following steps (1) and (2) may be performed in order of the step (1) and the step (2), and the following steps (1) to (4) may be performed in order of the step (1), the step (2), the step (3), and the step (4).

Step (1): a step of dicing the semiconductor wafer (workpiece) and the film-shaped firing material of the laminate formed by sequentially laminating the support sheet, the film-shaped firing material, and the semiconductor wafer (workpiece);

Step (2): a step of peeling the support sheet off from the film-shaped firing material to obtain a chip with the film-shaped firing material;

Step (3): a step of attaching the chip with the film-shaped firing material to the surface of a substrate; and Step (4): a step of firing the film-shaped firing material and bonding the chip and the substrate Hereinafter, a case of performing the steps (1) to (4) will be described.

The semiconductor wafer may be a silicon wafer or a silicon carbide wafer or may be a compound semiconductor wafer such as gallium arsenic. A circuit may be formed on the surface of the semiconductor wafer. The circuit on the wafer surface can be formed according to various methods which have been commonly used in the related art such as an etching method and a lift-off method. Next, a surface (rear surface) of the semiconductor wafer opposite to the circuit surface is ground. The grinding method is not particularly limited, and the surface is ground by known means using a grinder. At the time of grinding the rear surface, a pressure-sensitive adhesive sheet which is referred to as a surface-protective sheet is attached to the circuit surface for the purpose of protecting the circuit on the surface. The grinding of the rear surface is carried out by fixing the circuit surface side (that is, the surface-protective sheet side) of the wafer using a chuck table or the like and grinding the rear surface side where the circuit is not formed using a grinder. The thickness of the wafer after being ground is not particularly limited, but is typically in a range of 20 to 500 μm. Next, a fractured layer generated during the grinding of the rear surface is removed as necessary. The fractured layer is removed by performing chemical etching, plasma etching, or the like.

Next, the film-shaped firing material of the film-shaped firing material with a support sheet is attached to the rear surface of the semiconductor wafer. Thereafter, the steps (1) to (4) are performed in order of the step (1), the step (2), the step (3), and the step (4).

The laminate of the semiconductor wafer, the film-shaped firing material, and the support sheet is diced for each circuit formed on the surface of the wafer to obtain a laminate of the chip, the film-shaped firing material, and the support sheet. The dicing is performed by cutting the semiconductor wafer and the film-shaped firing material simultaneously. According to the film-shaped firing material with a support sheet according to the present embodiment, since the adhesive force is exhibited between the film-shaped firing material and the support sheet during the dicing, chipping and chip jump can be prevented. Therefore, the dicing adaptability is excellent. The dicing is not particularly limited, and a method of fixing the peripheral portion (an outer peripheral portion of a support) of the support sheet with the ring frame at the time of dicing the semiconductor wafer and dividing the semiconductor wafer according to a known technique of using a rotary round blade such as a dicing blade is an exemplary example of the dicing method. The film-shaped firing material may be completely cut, and the cut depth of the support sheet resulting from dicing is preferably in a range of 0 to 30 μm from the interface between the film-shaped firing material and the support sheet. By decreasing the amount of the support sheet to be cut, it is possible to suppress fusing of the pressure-sensitive adhesive layer or the base film constituting the support sheet caused by the friction of the dicing blade or generation of burrs and the like.

Further, particularly a chip obtained by dividing the semiconductor wafer having a surface on which a circuit is formed is also referred to as an element or a semiconductor element.

Thereafter, the support sheet may be expanded. In a case where a base film having excellent extensibility is selected as the base film of the support sheet, the support sheet has excellent expandability. By picking up the diced chips with the film-shaped firing material by general means such as a collet, the film-shaped firing material and the support sheet are peeled from each other. As a result, a chip (a chip with the film-shaped firing material) having a film-shaped firing material on the rear surface is obtained.

Next, the chip with the film-shaped firing material is attached to the surface of the substrate. The substrate includes a lead frame, a heat sink, and the like.

Next, the film-shaped firing material is fired so that the substrate and the chip are sinter-bonded. At this time, in a case where the exposed surface of the film-shaped firing material of the chip with the film-shaped firing material is attached to the substrate, the chip and the substrate can be sinter-bonded through the film-shaped firing material.

The heating temperature of firing the film-shaped firing material may be appropriately determined in consideration of the kind and the like of the film-shaped firing material, but is preferably in a range of 100° C. to 600° C., more preferably in a range of 150° C. to 550° C., and still more preferably in a range of 250° C. to 500° C. The heating time may be appropriately determined in consideration of the kind and the like of the film-shaped firing material, but is preferably in a range of 1 second to 60 minutes, more preferably in a range of 1 second to 30 minutes, and still more preferably in a range of 1 second to 10 minutes.

The film-shaped firing material may be fired by performing pressurizing and firing, in which the film-shaped firing material is fired by being pressurized. The condition for pressurization can be set to be, for example, in a range of 1 to 50 MPa.

According to the method of producing the substrate with a chip of the present embodiment, the film-shaped firing material with a highly uniform thickness can be simply formed on the rear surface of the chip, and cracks after the dicing step or the packing are unlikely to be generated. Further, according to the method of producing the substrate with a chip of the present embodiment, the chip with the film-shaped firing material can be obtained without separately attaching the film-shaped firing material to the rear surface of the divided chip, and thus the production step can be simplified. Further, a substrate with a chip in which the chip and the substrate are sinter-bonded through the film-shaped firing material by disposing the chip with the film-shaped firing material on a desired substrate and firing the substrate and the chip can be produced. Since the chip is bonded to the substrate using the film-shaped firing material according to the present invention, chip peeling is unlikely to occur. Further, chip shift is unlikely to occur even in a case where the chip and the substrate are transported in a state of being temporarily fixed by the film-shaped firing material before the firing.

As an embodiment, a chip with the film-shaped firing material which includes a chip and the film-shaped firing material according to the present invention is obtained. As an example, the chip with the film-shaped firing material can be produced according to the method of producing the substrate with a chip described above.

Further, in the above-described embodiment, the example of the sinter bonding between the chip and the substrate of the film-shaped firing material has been described, but the target for the sinter bonding of the film-shaped firing material is not limited to the example described above, and the sinter bonding can be performed on various products sintered in contact with the film-shaped firing material.

Further, according to the above-described embodiment, the film-shaped firing material having the same shape as the shape of chip can be processed by being divided together with the semiconductor wafer using a blade or the like, and a chip with the film-shaped firing material can be produced. That is, in the chip with the film-shaped firing material, the size (area) of the contact surface of the film-shaped firing material is the same as the size of the contact surface of the chip, but these may be different from each other. For example, the substrate and the chip may be attached to each other through the film-shaped firing material in a state in which the contact surface of the film-shaped firing material is larger than the contact surface of the chip. Specifically, the film-shaped firing material having a desired size is disposed on the substrate, and the chip having a contact surface smaller than that of the film-shaped firing material may be attached to the film-shaped firing material.

EXAMPLES

Hereinafter, the present invention will be described in detail based on the examples, and the scope of the present invention is not limited to these examples and the like.

Examples 1 to 3 and Comparative Examples 1 and 2

<Production of Firing Material Composition>
Components used for producing a firing material composition will be described. Here, metal particles having a particle diameter of 100 nm or less are noted as "sinterable metal particles".
(Sinterable Metal Particle Inclusion Paste Material)
Alconano Ag Paste ANP-1 (organic coated composite silver nanopaste, Nanoparticle Laboratory Corporation: alcohol derivative coated silver particles, metal content of 70% by mass or greater, 60% by mass or greater of silver particles (sinterable metal particles) with average particle diameter of 100 nm or less)
Alconano Ag Paste ANP-4 (organic coated composite silver nanopaste, Nanoparticle Laboratory Corporation: alcohol derivative coated silver particles, metal content of 80% by mass or greater, 25% by mass or greater of silver particles (sinterable metal particles) with average particle diameter of 100 nm or less)
(Binder Component)
Acrylic polymer 1 (2-ethylhexyl methacrylate polymer, mass-average molecular weight of 260000, L-0818, manufactured by The Nippon Synthetic Chemical Industry Co., Ltd., MEK diluted product, solid content of 58.4% by mass, Tg: −10° C.)

Based on the formulation listed in Table 1, firing material compositions of Examples 1 to 3 and Comparative Examples 1 and 2 were obtained by mixing respective components. The value of each component in Table 1 indicates parts by mass. Since the sinterable metal particle inclusion paste material is sold in a state of containing a high-boiling-point solvent and this solvent remains in the film-shaped firing material after coating or drying, the components of the sinterable metal particle inclusion paste material are described together with such components. In consideration of volatilization of the solvent in the binder component at the time of drying, the solid content is noted in terms of parts by mass by removing the solvent component. Further, each numerical value in parentheses in Table 1 indicates the amount (% by mass) of the sinterable metal particles contained in the firing material composition in a case where the total mass of the firing material composition is set to 100% by mass.

<Production of Film-Shaped Firing Material>
One surface of a release film (SP-PET 381031, manufactured by Lintec Corporation, thickness of 38 μm) as a polyethylene terephthalate-based film whose one surface was subjected to a peeling treatment was coated with the firing material composition obtained in the above-described manner and dried at 110° C. for 10 minutes, thereby obtaining a film-shaped firing material having the thickness listed in Table 1.

<Measurement and Evaluation of Film-Shaped Firing Material>
The following items of the obtained film-shaped firing materials were measured and evaluated.
(Measurement of Thickness)
The thickness of the film-shaped firing material was measured using a constant pressure thickness-measuring device (product name: "PG-02", manufactured by Techlock, Inc.) in conformity with JIS K 7130.
(Measurement of Shrinkage Factor)
The film-shaped firing material with a release film obtained in the above-described manner was cut into a circular shape having a diameter of 5 mm and attached onto the upper surface of a cylindrical copper adherend (α) having a height of 5 mm and a cross section with a diameter of 10 mm. The release film was peeled off, a cylindrical copper adherend (β) having a height of 2 mm and a cross section with a diameter of 5 mm was placed on the exposed surface of the film-shaped firing material such that the copper adherend overlapped with the film-shaped firing material, and the resulting material was pressurized and fired under the following condition (1) or (2) in an air atmosphere to obtain a test piece (X) for measuring the shrinkage factor.
(1) 350° C., 10 MPa, 3 minutes
(2) 400° C., 10 MPa, 3 minutes
A diameter (R) [mm] and a thickness (H) [mm] of the film-shaped firing material after being fired in the test piece (X) were measured, the shrinkage factor (A) [%] was acquired according to Equation (I), and the volume shrinkage factor (B) [%] was acquired according to Equation (II). The results are listed in Table 1.

$$\text{Shrinkage factor}(A)[\%]=\{1-(\text{area of shape of film-shaped firing material after being fired in plan view}/\text{area of shape of film-shaped firing material before being fired in plan view})\}\times 100 \quad \text{(I)}$$

$$\text{Volume shrinkage factor}(B)[\%]=\{1-(\text{volume of film-shaped firing material after being fired}/\text{volume of film-shaped firing material before being fired})\}\times 100 \quad \text{(II)}$$

Further, the area of the film-shaped firing material before being fired in a plan view was $(5/2)^2 \times \pi$ [mm$^2$], and the volume thereof was $(5/2)^2 \times \pi = \times 0.075$ [mm$^3$]. Meanwhile, the area of the film-shaped firing material after being fired was $(R/2)^2 \times \pi$ [mm$^2$], and the volume thereof was $(R/2)^2 \times \pi \times H$ [mm$^3$]. Further, $\pi$ is set to 3.14.

(Measurement of Contact Ratio)

A test piece (X) was obtained in the same manner as that for the measurement of the shrinkage factor.

The copper adherend (β) was peeled off from the copper adherend (α) by applying a force to the adhesive surface (the interface between the copper adherend (β) and the copper adherend (α)) of the test piece (X) at room temperature in the shear direction at a speed of 6 mm/min.

In a case where the peeling occurs at the interface between the copper adherend (β) and the film-shaped firing material, the area of the adhesion mark of the film-shaped firing material on the surface of the copper adherend (β) (that is, the surface of the chip onto which the film-shaped firing material is attached) was measured, and the area was set as the area of the film-shaped firing material after being fired.

In a case where cohesive fracture occurred in the film-shaped firing material, the thickness of the film-shaped firing material remaining on the surface of the copper adherend (β) was reduced to 20 μm or less, and the area of the film-shaped firing material was measured. This area was set as the area of the film-shaped firing material after being fired.

In a case where voids or marks thereof were found, the area of the voids was not included in the area of the film-shaped firing material after being fired.

The contact ratio (C) [%] was acquired according to Equation (III). The results are listed in Table 1.

Contact ratio($C$)[%]=(area of film-shaped firing material after being fired/area of surface of copper adherend(β)onto which film-shaped firing material is attached)×100    (III)

(Measurement of Adhesive Force)

A laminated film obtained by strongly attaching a polyethylene terephthalate (PET) film and the film-shaped firing material to each other was prepared by coating a PET film having a thickness of 12 μm with the firing material composition of each example and drying the composition so that the solvent was volatilized. A release film (thickness of 38 μm, SP-PET381031, manufactured by Lintec Corporation) was attached to the surface of the laminated film on the film-shaped firing material side for the purpose of surface protection. The obtained laminated film was cut to obtain a sheet for measuring the adhesive force with a width of 25 mm by cutting the entire release film.

A silicon wafer (manufactured by Science & Technology Inst., Co., diameter: 150 mm, thickness: 500 μm) whose surface was subjected to a chemical mechanical polishing treatment until the arithmetic average roughness (Ra) reached 0.02 μm or less was separately prepared as an adherend to adhere.

Next, the release film of the sheet for measuring the adhesive force with a width of 25 mm and a length of 100 mm or greater was peeled off, the surface where the film-shaped firing material was exposed was attached to the treated surface of the silicon wafer at 40° C., thereby obtaining a laminate formed of the silicon wafer and the sheet for measuring the adhesive force.

The obtained laminate was allowed to stand at 23° C. in an atmosphere of a relative humidity of 50% for 20 minutes, and a 180° peeling test was performed thereon using a universal tensile tester (5581 type tester, manufactured by Instron Corporation) in conformity with JIS Z 0237:2000. Specifically, the sheet for measuring the adhesive force was peeled off from the silicon wafer at a peeling speed of 300 mm/min. The peeling at this time was carried out by peeling the sheet for measuring the adhesive force in the length direction thereof such that the angle between the surface of the silicon wafer and the surface of the sheet for measuring the adhesive force which were in contact with each other reached 180°. Further, the load (peeling force) during this 180° peeling was measured, and the measured value was set as the adhesive force (D) [mN/25 mm]. The results are listed in Table 1.

(Measurement of Arithmetic Average Roughness)

The unevenness of the surface of the film-shaped firing material from which the release film was peeled off was measured in a range of 700×500 μm$^2$ at a cutoff of 2.5 mm using a shape measuring laser microscope (3D laser microscope VK-9700, manufactured by Keyence Corporation) with conformity with JIS B 0601:2001, and the arithmetic average roughness (Ra) was measured. The results are listed in Table 1.

(Evaluation of Chip Shift)

The copper adherend (a) and the copper adherend (β) were attached to each other through the film-shaped firing material in the same manner as that for the measurement of the shrinkage factor. The copper adherend (β) was peeled off from the copper adherend (α) by applying a force to the adhesive surface between the copper adherend (α) and the copper adherend (β) at room temperature in the shear direction at a speed of 6 mm/min. Here, the presence of shift between the copper adherend (β) and the film-shaped firing material before being fired was confirmed, and the result was set as the presence of chip shift. The results are listed in Table 1.

(Evaluation of Chip Peeling (Measurement of Shear Adhesive Force))

A test piece (X) was obtained in the same manner as that for the measurement of the shrinkage factor. A force was applied to the adhesive surface of the test piece (X) at room temperature in the shear direction at a speed of 6 mm/min, the strength at which the adhesion state was broken was measured, and the result was set as the shear adhesive force. In a case where the shear adhesive force was 50 MPa or greater, chip peeling was evaluated as "not found" because chip peeling was unlikely to occur in various environments. In a case where the shear adhesive force was less than 50 MPa, the chip peeling was evaluated as "found". The results are listed in Table 1.

(Presence of Frame Phenomenon)

The adhesion mark of the film-shaped firing material on the rear surface of the copper adherend (β) or the film-shaped firing material remaining on the rear surface of the copper adherend (β) was observed during the measurement of the contact ratio, and the presence of the portion where the film-shaped firing material was not present in the form of a frame was confirmed. The results are listed in Table 1.

TABLE 1

| | | | Example 1 | Example 2 | Example 3 | Comparative Example 1 | Comparative Example 2 |
|---|---|---|---|---|---|---|---|
| Firing material composition | Sinterable metal particle inclusion paste material [part by mass] | ANP-1 | 87.7 (>52.6) | 0 | 0 | 0 | 0 |
| | | ANP-4 | 0 | 86.8 (>21.7) | 86.8 (>21.7) | 45.0 (>11.2) | 98.2 (>24.5) |
| | Binder component [part by mass] | Acrylic polymer 1 | 12.3 | 13.2 | 13.2 | 55.0 | 1.8 |
| | Sinterable metal particle inclusion paste material/binder component | | 7.1 | 6.6 | 6.6 | 0.82 | 54.6 |
| Thickness [μm] | | | 75 | 75 | 75 | 75 | 75 |
| Conditions for pressurizing and firing | | Temperature [° C.] | 350 | 350 | 400 | 350 | 350 |
| | | Pressure [MPa] | 10 | 10 | 10 | 10 | 10 |
| | | Time [min] | 3 | 3 | 3 | 3 | 3 |
| Shrinkage factor (A) [%] | | | 3 | 5 | 4 | 12 | 1 |
| Volume shrinkage factor (B) [%] | | | 58 | 58 | 58 | 92 | 14 |
| Contact ratio (C) | | | 97 | 95 | 96 | 93 | 99 |
| Adhesive force (D) [mN/25 mm] | | | 1.1 | 1.5 (Cohesive fracture) | 1.5 (Cohesive fracture) | 2.3 | 0.1 |
| Arithmetic average roughness (Ra) [μm] | | | 0.25 | 0.28 | 0.28 | 0.21 | 0.58 |
| Evaluation | Chip shift | | Not found | Not found | Not found | Not found | Found |
| | Chip peeling (shear adhesive force [MPa]) | | Not found (93) | Not found (73) | Not found (55) | Found (35) | Not found (53) |
| | Frame phenomenon | | Not found | Not found | Not found | Found | Not found |

As shown in Table 1, in the film-shaped firing materials of Examples 1 to 3, chip shift during the transport before the firing or the chip peeling after the firing was unlikely to occur as compared with the film-shaped firing materials of Comparative Examples 1 and 2.

Each configuration in each embodiment and the combination thereof are merely examples, and addition, omission, substitution, and other modification of configurations can be made within a range not departing from the scope of the present invention. Further, the present invention is not limited to the embodiments and only limited by the scope of the claims.

REFERENCE SIGNS LIST

1: film-shaped firing material
2: support sheet
3: base film
4: pressure-sensitive adhesive layer
5: ring frame
6: adherend
10: sinterable metal particles
20: binder component
100a: film-shaped firing material with a support sheet
100b: film-shaped firing material with a support sheet

The invention claimed is:

1. A film-shaped firing material, comprising:
sinterable metal particles; and
a binder component,
wherein a content of the sinterable metal particles is in a range of 15% to 98% by mass,
a content of the binder component is in a range of 2% to 50% by mass,
a shrinkage factor in a planar direction of the film-shaped firing material after being pressurized and fired under conditions of a temperature of 350° C. and a pressure of 10 MPa for 3 minutes is 10% or less with respect to the shrinkage factor before the firing, and a volume shrinkage factor thereof is in a range of 15% to 90% with respect to the volume shrinkage factor before the firing, and
a contact ratio of the film-shaped firing material with an adherend after being pressurized and fired under conditions of a temperature of 350° C. and a pressure of 10 MPa for 3 minutes in a state in which the film-shaped firing material is in contact with the adherend is 90% or greater with respect to a contact area of the adherend.

2. The film-shaped firing material according to claim 1, wherein an arithmetic average roughness (Ra) of at least one surface of the film-shaped firing material is 0.5 μm or less.

3. The film-shaped firing material according to claim 1, wherein an adhesive force of the film-shaped firing material before being fired to a silicon wafer is 0.2 mN/25 mm or greater.

4. A film-shaped firing material with a support sheet comprising:
the film-shaped firing material according to any one of claim 1; and
a support sheet which is provided on at least one side of the film-shaped firing material.

5. The film-shaped firing material with a support sheet according to claim 4,
wherein the support sheet includes a base film and a pressure-sensitive adhesive layer provided on the base film, and
the film-shaped firing material is provided on the pressure-sensitive adhesive layer.

* * * * *